US011942455B2

(12) United States Patent
Ko et al.

(10) Patent No.: US 11,942,455 B2
(45) Date of Patent: Mar. 26, 2024

(54) STACKED SEMICONDUCTOR DIES FOR SEMICONDUCTOR DEVICE ASSEMBLIES

(71) Applicant: Micron Technology, Inc., Boise, ID (US)

(72) Inventors: Yeongbeom Ko, Taichung (TW); Youngik Kwon, Taichung (TW); Jong Sik Paek, Taichung (TW); Jungbae Lee, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/741,799

(22) Filed: May 11, 2022

(65) Prior Publication Data

US 2022/0271013 A1 Aug. 25, 2022

Related U.S. Application Data

(63) Continuation of application No. 17/001,435, filed on Aug. 24, 2020, now Pat. No. 11,362,071.

(51) Int. Cl.
| | |
|---|---|
| *H01L 25/065* | (2023.01) |
| *H01L 21/56* | (2006.01) |
| *H01L 21/768* | (2006.01) |
| *H01L 23/00* | (2006.01) |

(Continued)

(52) U.S. Cl.
CPC .......... *H01L 25/0657* (2013.01); *H01L 21/56* (2013.01); *H01L 21/76802* (2013.01); *H01L 23/31* (2013.01); *H01L 23/5384* (2013.01); *H01L 23/5386* (2013.01); *H01L 24/06* (2013.01); *H01L 24/85* (2013.01)

(58) Field of Classification Search
CPC ............ H01L 2225/06562; H01L 2225/06558
See application file for complete search history.

(56) References Cited

U.S. PATENT DOCUMENTS

| 2009/0017583 | A1* | 1/2009 | Jun ..................... H01L 23/3128 257/E25.013 |
|---|---|---|---|
| 2011/0084374 | A1 | 4/2011 | Chen |
| 2011/0241183 | A1 | 10/2011 | Lin et al. |

(Continued)

OTHER PUBLICATIONS

TW Patent Application No. 110129295—Taiwanese Office Action and Search Report, dated May 24, 2022, with English Translation, 17 pages.

(Continued)

*Primary Examiner* — Yu-Hsi D Sun
(74) *Attorney, Agent, or Firm* — Perkins Coie LLP

(57) ABSTRACT

Stacked semiconductor dies for semiconductor device assemblies and associated methods and systems are disclosed. In some embodiments, the semiconductor die assembly includes a substrate with a first opening in an inner portion and a second opening in an outer portion of the substrate. Further, the semiconductor die assembly can include a master die attached to a front side of the substrate, where the master die includes a first bond pad proximate to the first opening and a second bond pad proximate to the second opening. The first and second bond pads of the master die can be coupled with first and second substrate bond pads on a back side of the substrate, opposite to the front side, using first and second bonding wires extending through the first and second openings, respectively.

17 Claims, 4 Drawing Sheets

(51) Int. Cl.
    *H01L 23/31*           (2006.01)
    *H01L 23/538*         (2006.01)

(56)                References Cited

U.S. PATENT DOCUMENTS

| | | |
|---|---|---|
| 2011/0291295 A1* | 12/2011 | Isa .................. H01L 25/0657 |
| | | 257/777 |
| 2015/0035142 A1 | 2/2015 | Kim |
| 2015/0214178 A1 | 7/2015 | Crisp et al. |
| 2016/0233193 A1 | 8/2016 | Haba et al. |
| 2019/0355700 A1 | 11/2019 | Tan et al. |

OTHER PUBLICATIONS

TW Patent Application No. 110129295—Taiwanese Office Action and Search Report, dated Jul. 28, 2022, with English Translation, 12 pages.

\* cited by examiner

STACKED SEMICONDUCTOR DIES FOR SEMICONDUCTOR DEVICE ASSEMBLIES

CROSS-REFERENCE TO RELATED APPLICATION(S)

This application is a continuation of U.S. application Ser. No. 17/001,435, filed Aug. 24, 2020; which is incorporated herein by reference in its entirety.

TECHNICAL FIELD

The present disclosure generally relates to semiconductor die assemblies, and more particularly relates to stacked semiconductor dies for semiconductor device assemblies and associated systems and methods.

BACKGROUND

Semiconductor packages typically include one or more semiconductor dies (e.g., memory chips, microprocessor chip, imager chip) mounted on a substrate and encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

Market pressures continually drive semiconductor manufacturers to reduce the size and of die packages to fit within the space constraints of electronic devices, while also pressuring them to reduce cost associated with fabricating the die packages. In some semiconductor packages, two or more semiconductor dies are stacked on top of each other to reduce the footprint of the semiconductor packages. In some cases, the semiconductors dies may include through-substrate vias (TSVs) to facilitate stacking of the semiconductor dies.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

DETAILED DESCRIPTION

Figure 1:
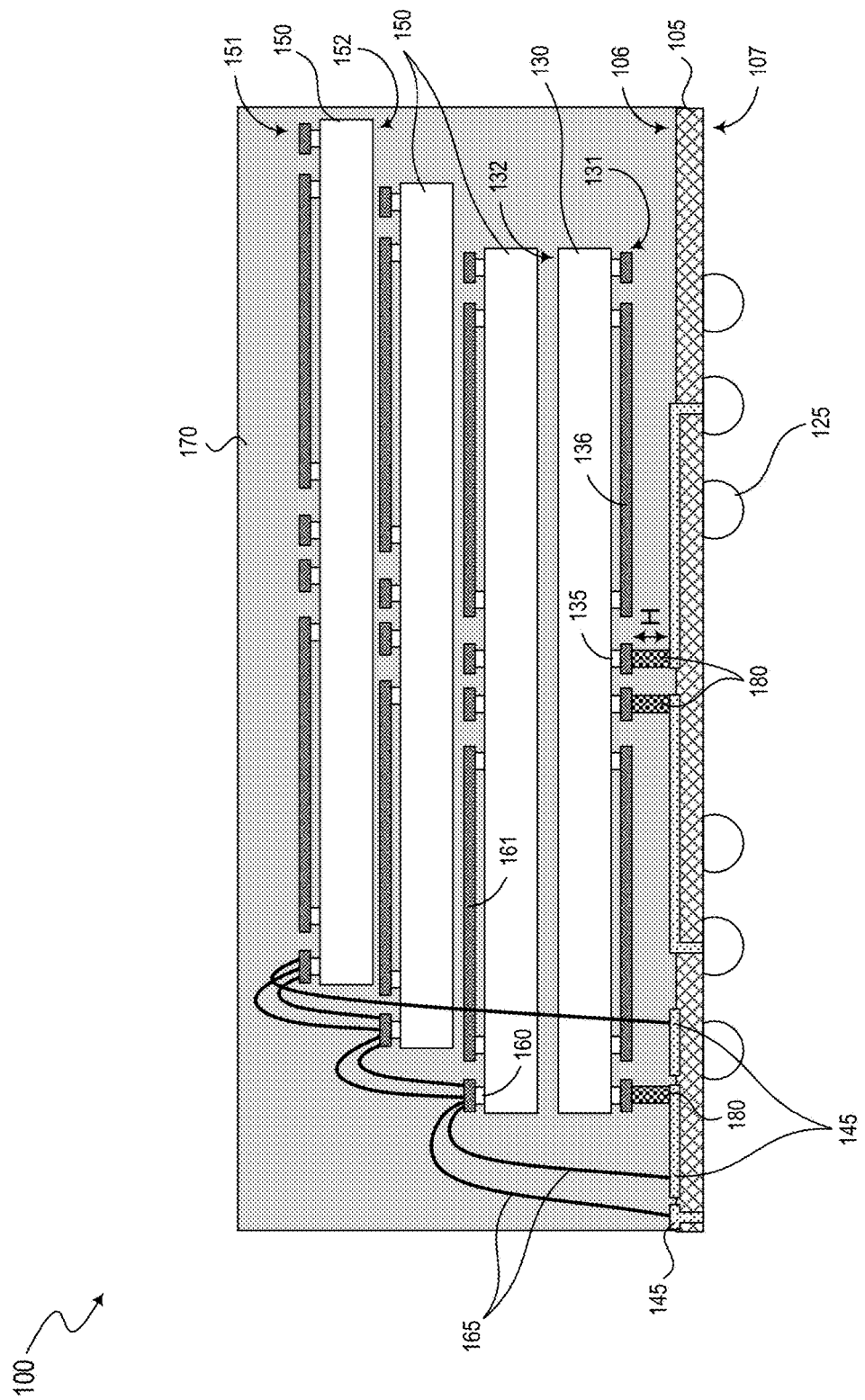
FIG. 1 is a cross-sectional diagram of a semiconductor die assembly.

Specific details of several embodiments of stacked semiconductor dies for semiconductor device assemblies, and associated systems and methods are described below. The term "semiconductor device or die" generally refers to a solid-state device that includes one or more semiconductor materials. Examples of semiconductor devices (or dies) include logic devices, memory devices, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates.

In certain semiconductor packages, a package substrate (which may also be referred to as a support substrate, a substrate, or the like) may carry a first semiconductor die, over which one or more second semiconductor dies are arranged. In some cases, the first semiconductor die is different from the second semiconductor dies—e.g., the first semiconductor die is a memory controller die and the one or more second semiconductor dies are memory dies. In other cases, the first semiconductor die is structurally identical to the second semiconductor dies. For example, the first semiconductor die and the one or more second semiconductor dies are memory dies of a same kind—e.g., a stack of dynamic random access memory (DRAM) dies. In such cases, the bottommost die of the stack (e.g., the DRAM die attached to the substrate, the first semiconductor die) may serve as a master die for the remaining semiconductor dies of the stack, which may be referred to as slave dies (e.g., the remaining DRAM dies of the stack).

Small form factor packages present challenges for accommodating the stack of semiconductor dies (e.g., DRAM dies) above the substrate. In some embodiments, the semiconductor dies may have TSVs that facilitates in-line stacking of the semiconductor dies to reduce the footprint of the stack. Forming the TSVs, however, tends to increase costs of the semiconductor device assemblies. In some embodiments, the master die may be flipped (e.g., having its active surface with conductive pillars facing the substrate) and directly connected to the substrate (e.g., conductive pads of the substrate are electrically connected to the conductive pillars of the master die), which may be referred to as a flip-chip or a direct chip attachment (DCA) scheme. Process steps generating the conductive pillars (and other structures facilitating the conductive pillars to connect to contact pads of the master die) and connecting the conductive pillars to corresponding conductive pads of the substrate may be referred to a bumping process. Typically, the bumping process tends to be a costly process for forming semiconductor device assemblies—e.g., in view of a number of process modules involved (e.g., thin film deposition, photolithography, etching, cleaning) and various yield and/or reliability issues associated with the bumping process.

Aspects of the present technology facilitates providing lower cost alternatives to generate semiconductor die assemblies with stacks of semiconductor dies—e.g., without using the TSVs and/or the bumping process. As described in more detail herein, the master die may be flipped to have its active surface facing the substrate. In this manner, the signal integrity (e.g., propagation delays) can be maintained comparable with the semiconductor assemblies employing the bumping process. Further, the substrate may include openings in the substrate, which extend from the front to the back surfaces of the substrate. The substrate also includes substrate bond pads on the back surface such that bonding wires can be formed to electrically couple the bond pads of the master die to the substrate bond pads on the back surface through the openings, in lieu of the bumping process.

Additionally, the slave dies may be positioned over the master die to have their active surfaces facing away from the substrate. In this manner, bonding wires may be formed to electrically couple bond pads of the slave dies with substrate bond pads on the front surface of the substrate. As such, both the master die and the slave dies establish electrical connections to the substrate, which can be configured to operatively couple the master die with the slave dies—e.g., by conductive traces in the substrate. Thus, the master die and the slave dies may establish electrical connections between them through conductive traces in the substrate, in lieu of the TSVs.

As used herein, the terms "front," "back," "vertical," "lateral," "down," "up," "upper," "lower," "bottom," and "top" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1 is a cross-sectional diagram of a semiconductor die assembly 100 ("assembly 100"). The assembly 100 may include a substrate 105, a first semiconductor die 130 (e.g., a master die) attached to the substrate 105, and second semiconductor dies 150 (e.g., slave dies). Further, the assembly 100 illustrates bonding wires 165 between the second semiconductor dies 150 and the substrate 105, as well as interconnects 180 between the first semiconductor die 130 and the substrate 105.

The substrate 105 includes a front side 106 and a back side 107 opposite to the front side 106. The front side 106 may include various conductive structures, such as substrate bond pads 145 for bonding wires 165, conductive pads for interconnects 180, metallic traces and/or wires, or the like. The metallic traces may be configured to route electrical signals between the front side 106 (e.g., the conductive structures on the front side 106) and the back side 107 (e.g., terminals 125 on the back side 107). The terminals 125 on the back side 107 may couple the assembly 100 to other components—e.g., the assembly 100 mounted on a printed circuit board through the terminals 125, which carries the other components.

The first semiconductor die 130 includes a first side 131 and a second side 132 opposite to the first side 131. The first side 131 of the first semiconductor die 130 may include various conductive structures, such as bond pads 135, redistribution features 136 (e.g., metallic traces configured to route electrical signals among the bond pads 135), or the like. As illustrated in FIG. 1, the first semiconductor die 130 is arranged to have the first side 131 facing the front side 106 of the substrate 105—e.g., flipped when compared to the second semiconductor dies 150. Further, the first semiconductor die 130 is coupled to the substrate 105 by the interconnects 180 having a height H. In some embodiments, individual interconnects 180 includes a conductive pillar coupled to a bond pad (or a contact pad) of the first semiconductor die 130, a conductive pad of the substrate 105, and a bonding material (e.g., a solder material) between the conductive pillar and the conductive pad. In this manner, the first semiconductor die 130 can be attached to the substrate 105 and establishes electrical connections to the substrate 105.

The second semiconductor dies 150 includes a first side 151 (e.g., an active side in view of functional features of the second semiconductor dies 150 proximate to the first side 151) and a second side 152 (e.g., a passive side) opposite to the first side 151. FIG. 1 illustrates that the second semiconductor dies 150 are arranged to have the first side 151 facing away from the front side 106 of the substrate 105. In some embodiments, the second semiconductor dies 150 may be structurally identical to the first semiconductor die 130. For example, the first semiconductor die 130 may be a master die for the second semiconductor dies 150, and the second semiconductor dies 150 may be slave dies. The first side 151 of the second semiconductor dies 150 may include various conductive structures, such as bond pads 160, redistribution features 161 (e.g., metallic traces configured to route electrical signals among the bond pads 160), or the like. Further, an adhesive layer (not shown) may be disposed between the bottommost second semiconductor die and the first semiconductor die 130 to attach the second semiconductor dies 150 to the first semiconductor die 130. The second semiconductor dies 150 are coupled to the substrate 105 by the bond wires 165—e.g., the bond pads of the second semiconductor dies 150 (e.g., a bond pad 160) is coupled to the substrate bond pads 145 of the substrate 105 by the bonding wires 165. In this manner, the second semiconductor dies 150 can be attached to the first semiconductor die 130 and establishes electrical connections to the substrate 105.

As described above, the first semiconductor die 130 (e.g., a master die) can be electrically connected to the substrate 105 by the interconnects 180 and the second semiconductor dies 150 (e.g., slave dies) can be electrically connected to the substrate 105 by the bonding wires 165. The substrate 105 may be configured to operatively couple the first semiconductor die 130 and the second semiconductor dies 150—e.g., by the conductive traces of the substrate 105. Moreover, the first semiconductor die 130, the second semiconductor dies 150, and the bonding wires 165 may be encapsulated by a molding 170. The assembly 100 may provide a low cost alternative when compared to semiconductor die assemblies including semiconductor dies with TSVs. Further, the assembly 100 may provide a suitable signal transferability through the first semiconductor die 130 (e.g., with respect to an industry standard specification, such as Joint Electron Device Engineering Council (JEDEC)) in view of the flip-chip configuration of the first semiconductor die 130.

Figure 2:
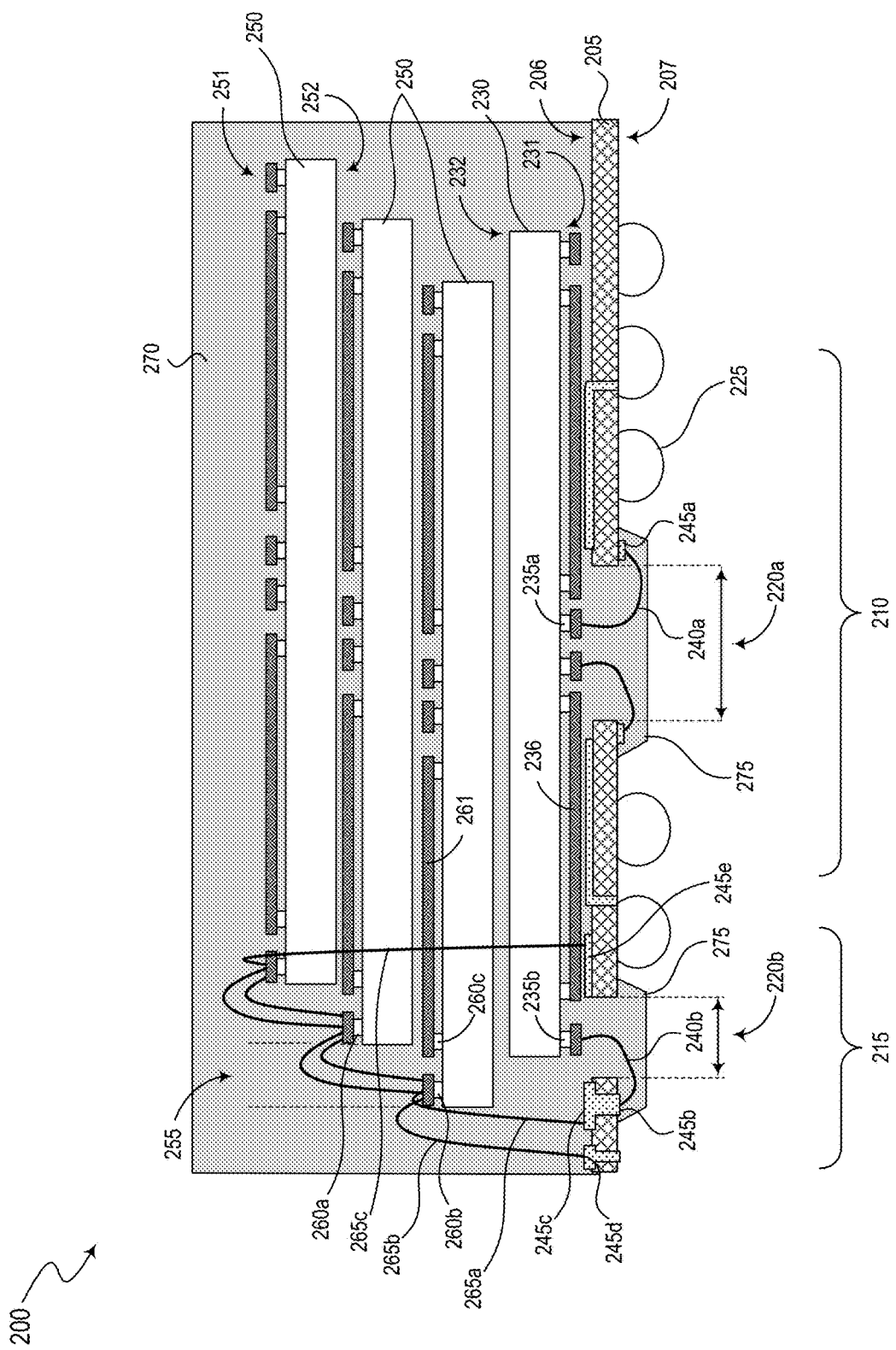
FIG. 2 is a cross-sectional diagram of a semiconductor die assembly configured in accordance with an embodiment of the present technology.

FIG. 2 is a cross-sectional diagram of a semiconductor die assembly 200 ("assembly 200"). The assembly 200 may include a substrate 205, a first semiconductor die 230 (e.g., a master die) attached to the substrate 205, and second semiconductor dies 250 (e.g., slave dies) arranged over the first semiconductor die 230. Further, the assembly 200 illustrates bonding wires 240 between the first semiconductor die 230 and the substrate 205, as well as bonding wires 265 between the second semiconductor dies 250 and the substrate 205. The first semiconductor die 230 may include aspects of the first semiconductor die 130. Moreover, the second semiconductor dies 250 may be examples of or include aspects of the second semiconductor dies 150.

The substrate 205 includes a front side 206 and a back side 207 opposite to the front side 206. The front side 206 may have various conductive structures, such as substrate bond pads 245 (also identified individually as 245c-d) for bonding wires 265, metallic traces and/or wires, or the like. Similarly, the back side 207 may have various conductive structures, such as substrate bond pads 245 (also identified individually as 245a and 245b) for bonding wires 240, metallic traces and/or wires, or the like. The metallic traces can be configured to provide electrical connections among various conductive structures. Further, the metallic traces may be configured to route electrical signals between the front side 206 (e.g., the conductive structures on the front side 206) and the back side 207 (e.g., the conductive structures on the back side 207 and terminals 225 on the back side 207). The terminals 225 on the back side 207 may couple the assembly 200 to other components—e.g., the assembly 200 mounted on a printed circuit board through the terminals 225, which carries the other components. In some embodiments, the terminals 225 includes solder balls. Moreover, the substrate 205 may include one or more openings 220. For example, the substrate 205 of the assembly 200 includes a first opening 220a in an inner portion 210 (e.g., a medial portion) and a second opening 220b in an outer portion 215 (e.g., a peripheral portion) of the substrate 205. The first and second openings 220a and 220b extend from the first side 206 to the second side 207 of the substrate 205.

The first semiconductor die 230 includes a first side 231 and a second side 232 opposite to the first side 231. The first side 231 may be referred to as an active side in view of functional features of the first semiconductor dies proximate to the first side 231. The second side 232 may be referred to as a passive side, opposite to the active side. The first side 231 of the first semiconductor die 230 may include various conductive structures, such as bond pads 235 (also identified individually as 235a and 235b), redistribution features 236 (e.g., metallic traces configured to route electrical signals among the bond pads 235), or the like. As illustrated in FIG. 2, the first semiconductor die 230 is arranged to have the first side 231 facing the front side 206 of the substrate 205—e.g., flipped when compared to the second semiconductor dies 250. In some embodiments, the first semiconductor die 230 is attached to the substrate 205 by an adhesive layer (not shown) disposed between the first side 231 of the first semiconductor die 230 and the front side 206 of the substrate 205. In some embodiments, the adhesive layer may have a thickness less than the height (H) of the interconnects 180 described with reference to FIG. 1. As such, a total height of the stack of semiconductor dies above the substrate 205 as depicted in FIG. 2 may be less than that of the stack of semiconductor dies of FIG. 1.

As illustrated in FIG. 2, the bond pads 235 of the first semiconductor die 230 may be arranged to be proximate to (e.g., adjacent to) the openings 220 of the substrate 205—e.g., accessible via the openings 220. In this manner, bonding wires (e.g., bonding wires 240) can be formed through the openings 220 to couple bond pads 235 of the first semiconductor die 230 to the substrate bond pads 245 (also identified individually as 245a and 245b) on the back side 207 of the substrate 205. For example, a first bonding wire 240a may couple the first bond pad 235a of the first semiconductor die 230 with a first substrate bond pad 245a on the back side 207 of the substrate 205 through the first opening 220a. Similarly, a second bonding wire 240b may couple the second bond pad 235b of the first semiconductor die 230 with a second substrate bond pad 245b on the back side 207 of the substrate 205 through the second opening 220b. In this manner, the first semiconductor die 230 can be attached to the substrate 205 (by the adhesive layer) and establishes electrical connections to the substrate 205 by the bonding wires 240 through the openings 220.

Although FIG. 2 depicts one bonding wire (e.g., the second bonding wire 240b) passing through one opening (e.g., the second opening 220b) and two bonding wires (e.g., the first bonding wire 240a and a neighboring bonding wire) passing through another opening (e.g., the first opening 220a), one skilled in the art will readily appreciate that the cross-sectional view just captures one or two of potentially many such bonding wires. In other words, multiple bonding wires (e.g., three, four, ten, twenty, even more) may pass through a single opening such that multiple bond pads of the first semiconductor die 230 can be coupled to multiple substrate bond pads on the back side 207 of the substrate 205. For example, the first opening 220a may be an elongated opening and the first semiconductor die 230 may have two columns of bond pads, where a first column of bond pads is arranged adjacent to a first side of the elongated opening and a second column of bond pads is arranged adjacent to a second side of the elongated opening. Further, the back side 207 of the substrate 205 may have two corresponding columns of substrate bond pads arranged next to each side of the elongated opening such that multiple bonding wires passing through the elongated opening can couple individual bond pads of the first semiconductor die 230 to corresponding substrate bond pads on the back side 207 of the substrate 205.

The second semiconductor dies 250 includes a first side 251 (e.g., an active side in view of functional features of the second semiconductor dies proximate to the first side 251) and a second side 252 (e.g., a passive side) opposite to the first side 251. FIG. 2 illustrates that the second semiconductor dies 250 are arranged to have the first side 251 facing away from the front side 206 of the substrate 205. In some embodiments, the second semiconductor dies 250 may be structurally identical to the first semiconductor die 230. For example, the first semiconductor die 230 may be a master die for the second semiconductor dies 250, and the second semiconductor dies 250 may be slave dies. The first side 251 of the second semiconductor dies 250 may include various conductive structures, such as bond pads 260 (also identified individually as 260a-c), redistribution features 261 (e.g., metallic traces configured to route electrical signals among the bond pads 260), or the like. As shown in FIG. 2, each of the second semiconductor dies 250 includes an exposed portion (e.g., exposed portions 255) uncovered by the second semiconductor dies 250 located above. As such, at least one side of the second semiconductor dies 250 extends past the corresponding side of the second semiconductor dies 250 located above. The second semiconductor dies 250 include one or more bond pads 260 (also identified individually as 260a and 260b) in the exposed portion 255 such that one or more bonding wires 265 can couple the one or more bond pads 260 in the exposed portion 255 to the substrate bond pads 245 (also identified individually as 245c-e) on the front side 206 of the substrate 205. In some cases, at least one substrate bond pad 260 may be coupled to a ground node of the semiconductor die assembly 200.

Further, an adhesive layer (not shown) may be disposed between the bottommost second semiconductor die and the first semiconductor die 230 to attach the second semiconductor dies 250 to the first semiconductor die 230. The second semiconductor dies 250 are coupled to the substrate 205 by the bond wires 265 (also identified individually as 265a-c)—e.g., the bond pads 260 of the second semiconductor dies 250 (e.g., the bond pad 260a, the bond pad 260b) coupled to the substrate bond pads 245 (also identified individually as 245c-e) of the front side 206 of the substrate 205 by the bonding wires 265. In this manner, the second semiconductor dies 250 can be attached to the first semiconductor die 230 and establishes electrical connections to the substrate 205.

As described above, the first semiconductor die 230 (e.g., a master die) can be electrically connected to the substrate 205 by the bonding wires 240 and the second semiconductor dies 250 (e.g., slave dies) can be electrically connected to the substrate 205 by the bonding wires 265. The substrate 205 may be configured to operatively couple the first semiconductor die 230 and the second semiconductor dies 250—e.g., by the conductive traces of the substrate 205. As such, the first semiconductor die 230 operatively couples with the second semiconductor dies 250 through one or more bonding wires 265 in combination with the first bonding wire 240a, the second bonding wire 240b, or both.

Moreover, the first semiconductor die 230, the second semiconductor dies 250, and the bonding wires 265 may be encapsulated by a first molding 270 on the front side 206 of the substrate 205. Further, the assembly 200 may include a second molding 275 on the back side 207 of the substrate 205, where the second molding 275 extends into the first opening 220a, the second opening 220b, or both. Additionally, the second molding 275 may encapsulate the first bonding wire 240a, the second bonding wire 240b, or both. The assembly 200 may provide a low cost alternative when compared to semiconductor die assemblies including semiconductor dies with TSVs and/or a direct chip attachment scheme e.g., the interconnect 180 described with reference to FIG. 1. Further, the assembly 100 may provide a suitable signal transferability through the first semiconductor die 230 (e.g., with respect to an industry standard specification, such as JEDEC) in view of the flip-chip configuration of the first semiconductor die 230.

Figure 3:
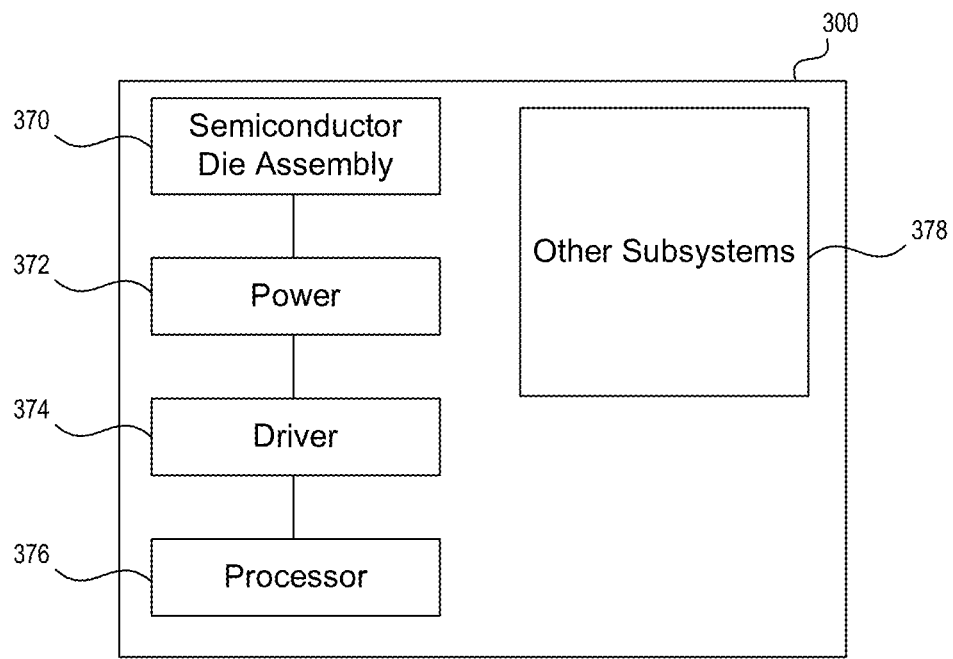
FIG. 3 is a block diagram schematically illustrating a system including a semiconductor die assembly configured in accordance with an embodiment of the present technology.

The semiconductor die assembly (e.g., the semiconductor die assemblies 200) described above with reference to FIG. 2 can be incorporated into any of a myriad of larger and/or more complex systems, a representative example of which is a system 300 shown schematically in FIG. 3. The system 300 can include a semiconductor die assembly 370, a power source 372, a driver 374, a processor 376, and/or other subsystems or components 378. The semiconductor die assembly 370 can include features generally similar to those of the semiconductor die assemblies described above and can therefore include a substrate with a first opening in an inner portion and a second opening in an outer portion of the substrate. Further, the semiconductor die assembly 370 can include a master die attached to a front side of the substrate, where the master die includes a first bond pad proximate to the first opening and a second bond pad proximate to the second opening. The first bond pad of the master die may be coupled with a first substrate bond pad on a back side of the substrate, opposite to the front side, using a first bonding wire extending through the first opening. Similarly, the second bond pad of the master die may be coupled with a second substrate bond pad on the back side of the substrate using a second bonding wire extending through the second opening.

The resulting system 300 can perform any of a wide variety of functions, such as memory storage, data processing, and/or other suitable functions. Accordingly, representative systems 300 can include, without limitation, handheld devices (e.g., mobile phones, tablets, digital readers, and digital audio players), computers, and appliances. Components of the system 300 may be housed in a single unit or distributed over multiple, interconnected units (e.g., through a communications network). The components of the system 300 can also include remote devices and any of a wide variety of computer readable media.

Figure 4:
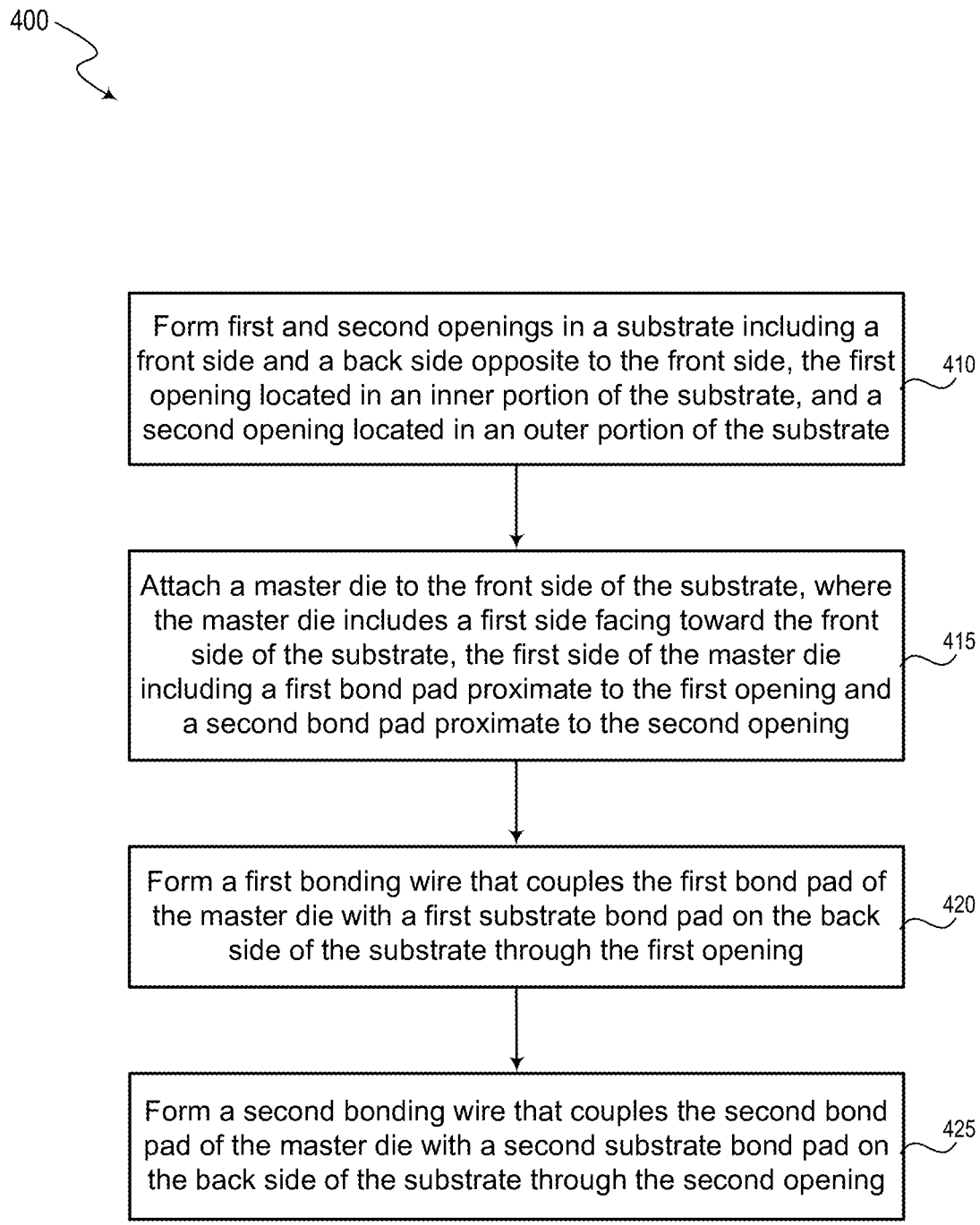
FIG. 4 is a flowchart of a method of forming a semiconductor die assembly configured in accordance with embodiments of the present technology.

FIG. 4 is a flowchart 400 illustrating a method of forming a semiconductor die assembly configured in accordance with embodiments of the present technology. The method includes forming first and second openings in a substrate including a front side and a back side opposite to the front side, the first opening located in an inner portion of the substrate, and a second opening located in an outer portion of the substrate (box 410). The method further includes attaching a master die to the front side of the substrate, where the master die includes a first side facing toward the front side of the substrate, the first side of the master die including a first bond pad proximate to the first opening and a second bond pad proximate to the second opening (box 415). The method further includes forming a first bonding wire that couples the first bond pad of the master die with a first substrate bond pad on the back side of the substrate through the first opening (box 420). The method further includes forming a second bonding wire that couples the second bond pad of the master die with a second substrate bond pad on the back side of the substrate through the second opening (box 425).

In some embodiments, the method may further include attaching one or more slave dies to the master die, where each of the one or more slave dies includes an exposed portion including a third bond pad, and attaching one or more third bonding wires that couple one or more third bond pads of the one or more slave dies with a third substrate bond pad on the first side of the substrate. In some embodiments, the method may further include forming a first molding on the front side of the substrate, the first molding encapsulating the master die and the one or more slave dies, and forming a second molding on the back side of the substrate, the second molding extending into the first opening, the second opening, or both and encapsulating the first bonding wire, the second bonding wire, or both. In some embodiments, the master die may operatively couple with the one or more slave dies through the one or more third bonding wires in combination with the first bonding wire, the second bonding wire, or both.

From the foregoing, it will be appreciated that specific embodiments of the technology have been described herein for purposes of illustration, but that various modifications may be made without deviating from the disclosure. For example, although the embodiments of the semiconductor die assemblies are described with four (4) semiconductor dies (e.g., one master die and three slave dies), in other embodiments, the semiconductor die assemblies can be configured to have a different quantity (e.g., two, three, five, six, eight, even more) of semiconductor dies. Further, although the embodiments of the semiconductor die assemblies are described with slave dies arranged in a pattern resembling stair-steps with bonding wires coupling bond pads of the slave dies with corresponding substrate bond pads, the present technology is not limited thereto. For example, the semiconductor dies may be arranged in a zig-zag pattern with at least one side of the semiconductor dies are exposed for bonding wire formation to couple bond pads of the slave dies with corresponding substrate bond pads.

Further, although in the foregoing example embodiment, the substrate with two openings has been described and illustrated, in other embodiments, the substrate may be provided with three or more such openings. In addition, the openings may be formed anywhere (e.g., not limited to inner and outer portions) in the substrate to provide accesses to the bond pads of the master die such that bonding wires can be formed to couple the bond pads of the master die to corresponding substrate bond pads of the substrate through the openings. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device (or die), may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
   a substrate including a front side and a back side opposite to the front side, wherein the substrate includes a first opening and a second opening;
   a first die attached to the front side of the substrate, wherein the first die includes a first side facing toward the front side of the substrate, the first side of the first die including a first bond pad proximate to the first opening and a second bond pad proximate to the second opening;
   a first bonding wire coupled to the first bond pad of the first die and extending through the first opening to couple with a first substrate bond pad on the back side of the substrate;
   a second bonding wire coupled to the second bond pad of the first die and extending through the second opening to couple with a second substrate bond pad on the back side of the substrate;
   one or more second dies disposed over the first die, wherein each of the one or more second dies includes an exposed portion including a third bond pad; and
   one or more third bonding wires coupling one or more third bond pads of the one or more second dies with a third substrate bond pad on the front side of the substrate, the third substrate bond pad being directly coupled to the second substrate bond pad by a conductive structure extending through the substrate.

2. The semiconductor die assembly of claim 1, wherein the first die operatively couples with the one or more second dies through the one or more third bonding wires in combination with the first bonding wire, the second bonding wire, or both.

3. The semiconductor die assembly of claim 1, wherein the third substrate bond pad is coupled to a ground node of the semiconductor die assembly.

4. The semiconductor die assembly of claim 1, further comprising:
   a first molding on the front side of the substrate, the first molding encapsulating the first die and the one or more second dies; and
   a second molding on the back side of the substrate, the second molding extending into the first opening, the second opening, or both and encapsulating the first bonding wire, the second bonding wire, or both.

5. The semiconductor die assembly of claim 1, wherein the first die is structurally identical to the one or more second dies.

6. The semiconductor die assembly of claim 1, wherein:
   each of the one or more second dies includes an active side and a passive side opposite to the active side, and
   the active sides of the one or more second dies are facing away from the front side of the substrate.

7. The semiconductor die assembly of claim 6, further comprising:
   an adhesive layer between a second side of the first die opposite to the first side and the passive side of a bottommost second die of the one or more second dies.

8. The semiconductor die assembly of claim 1, further comprising a molding on the back side of the substrate, wherein:
   the molding extends into the first opening, the second opening, or both; and
   the molding encapsulates the first bonding wire, the second bonding wire, or both.

9. The semiconductor die assembly of claim 1, wherein the first and second openings extend from the first side to the second side.

10. A semiconductor die assembly, comprising:
    a package substrate including a front side and a back side opposite to the front side, wherein the package substrate includes a first opening and a second opening;
    a first semiconductor die attached to the front side of the package substrate, wherein the first semiconductor die includes a first side facing toward the front side of the package substrate, the first side of the first semiconductor die including a first bond pad aligned with the first opening and a second bond pad aligned with the second opening;
    a first bonding wire coupled to the first bond pad of the first semiconductor die and passing through the first opening to couple with a first substrate bond pad on the back side of the substrate;
    a second bonding wire coupled to the second bond pad of the first semiconductor die and passing through the second opening to couple with a second substrate bond pad on the back side of the substrate;

a second semiconductor die attached to the first semiconductor die, wherein the second semiconductor die includes an active side facing away from the first semiconductor die, the active side of the second semiconductor die including a third bond pad; and a third bonding wire coupling the third bond pad of the second semiconductor die with a third substrate bond pad on the first side of the package substrate, the third substrate bond pad being directly coupled to the second bond pad by a conductive structure extending through the substrate.

11. The semiconductor die assembly of claim 10, wherein the first semiconductor die operatively couples with the second semiconductor die through the third bonding wire in combination with the first bonding wire, the second bonding wire, or both.

12. The semiconductor die assembly of claim 10, further comprising:

a third semiconductor die attached to the second semiconductor die, wherein the third bonding wire further couples the third substrate bond pad with a fourth bond pad on an active side of the third semiconductor die.

13. The semiconductor die assembly of claim 10, further comprising:

a molding on the back side of the package substrate, the molding encapsulating the first bonding wire, the second bonding wire, or both.

14. The semiconductor die assembly of claim 10, wherein the first semiconductor die is structurally identical to the second semiconductor die.

15. A method, comprising:

attaching a first die to the front side of a substrate, wherein the first die includes a first side facing toward the front side of the substrate and including a first bond pad proximate to a first opening in the substrate and a second bond pad proximate to a second opening in the substrate;

forming a first bonding wire that couples to the first bond pad of the first die and extends through the first opening to couple with a first substrate bond pad on a back side of the substrate;

forming a second bonding wire that couples to the second bond pad of the first die and extends through the second opening to couple with a second substrate bond pad on the back side of the substrate;

attaching one or more second dies to the first die, wherein each of the one or more second dies includes an exposed portion including a third bond pad; and attaching one or more third bonding wires that couple one or more third bond pads of the one or more second dies with a third substrate bond pad on the first side of the substrate, the third substrate bond pad being directly coupled to the second bond pad by a conductive structure extending through the substrate.

16. The method of claim 15, further comprising:

forming a first molding on the front side of the substrate, the first molding encapsulating the first die and the one or more second dies; and forming a second molding on the back side of the substrate, the second molding extending into the first opening, the second opening, or both and encapsulating the first bonding wire, the second bonding wire, or both.

17. The method of claim 15, wherein the first die operatively couples with the one or more second dies through the one or more third bonding wires in combination with the first bonding wire, the second bonding wire, or both.

* * * * *